(12) United States Patent
Graetz et al.

(10) Patent No.: US 9,658,279 B2
(45) Date of Patent: May 23, 2017

(54) CONTACTLESS DAMAGE INSPECTION OF PERIMETER REGION OF SEMICONDUCTOR DEVICE

(71) Applicant: Infineon Technologies AG, Neubiberg (DE)

(72) Inventors: Eric Graetz, Krumpendorf (AT); Hermann Bilban, Villach-Landskron (AT); Rudolf Pairleitner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/923,052

(22) Filed: Oct. 26, 2015

(65) Prior Publication Data

US 2016/0124039 A1 May 5, 2016

(30) Foreign Application Priority Data

Oct. 30, 2014 (DE) .................. 10 2014 222 203

(51) Int. Cl.
*G01R 31/265* (2006.01)
*G01R 31/26* (2014.01)
(Continued)

(52) U.S. Cl.
CPC ..... *G01R 31/2656* (2013.01); *G01R 31/2607* (2013.01); *H01L 21/768* (2013.01); *H01L 22/32* (2013.01); *H01L 22/34* (2013.01); *H01L 23/528* (2013.01); *H01L 23/5223* (2013.01); *H01L 23/5227* (2013.01); *H01L 29/0688* (2013.01); *H01L 29/1608* (2013.01); *H01L 2924/0002* (2013.01)

(58) Field of Classification Search
CPC ....... G01R 31/265; G01R 31/26; H01L 29/16; H01L 29/06; H01L 21/768; H01L 21/66; H01L 23/522; H01L 23/528
USPC .............................................. 438/618; 257/48
See application file for complete search history.

(56) References Cited

U.S. PATENT DOCUMENTS

| 5,631,572 A * | 5/1997 | Sheen ................. | G01R 31/046 324/754.08 |
| 7,057,518 B2 * | 6/2006 | Schmidt ................ | H04W 24/00 324/500 |

(Continued)

FOREIGN PATENT DOCUMENTS

| CA | 2409435 A1 | 11/2001 |
| JP | S6387736 A | 4/1988 |

(Continued)

*Primary Examiner* — Caleb Henry
(74) *Attorney, Agent, or Firm* — Murphy, Bilak & Homiller, PLLC

(57) ABSTRACT

A power semiconductor device includes a semiconductor body. The semiconductor body includes an active semiconductor region and a perimeter semiconductor region surrounding the active semiconductor region. The active semiconductor region has an active surface area, and the perimeter semiconductor region has a perimeter surface area. The power semiconductor device further includes a test structure for contactless testing of the perimeter semiconductor region. The test structure includes an electrically conductive path mounted on the perimeter surface area. The test structure is configured to extract energy from a remotely generated electromagnetic radio frequency test field.

18 Claims, 5 Drawing Sheets

(51) Int. Cl.
*H01L 21/768* (2006.01)
*H01L 21/66* (2006.01)
*H01L 23/522* (2006.01)
*H01L 23/528* (2006.01)
*H01L 29/06* (2006.01)
*H01L 29/16* (2006.01)

(56) References Cited

U.S. PATENT DOCUMENTS

| | | | | |
|---|---|---|---|---|
| 7,112,952 B2* | 9/2006 | Arai | | G01R 31/2886 324/762.09 |
| 7,220,990 B2* | 5/2007 | Aghababazadeh | | G01R 31/2831 257/48 |
| 7,547,578 B2* | 6/2009 | Agarwal | | H01L 21/0485 438/113 |
| 7,724,012 B2* | 5/2010 | Marshall | | G01R 31/3025 324/754.29 |
| 7,915,909 B2* | 3/2011 | Dunn | | G01R 31/2822 324/762.01 |
| 7,960,242 B2* | 6/2011 | Or-Bach | | G11C 17/14 257/E21.023 |
| 7,986,042 B2* | 7/2011 | Or-Bach | | H01L 21/26506 257/773 |
| 8,405,420 B2* | 3/2013 | Or-Bach | | G03F 9/7076 326/101 |
| 8,829,934 B2* | 9/2014 | Sellathamby | | G01R 31/3025 324/754.03 |
| 8,847,617 B2* | 9/2014 | Nickel | | G01R 31/3025 324/754.21 |
| 9,134,368 B2* | 9/2015 | Kuo | | H01L 23/58 |
| 9,297,853 B2* | 3/2016 | Benoit | | G01R 31/2884 |
| 9,372,228 B2* | 6/2016 | Nickel | | G01R 31/3025 |
| 2003/0016039 A1* | 1/2003 | Williams | | G01R 1/07328 324/755.05 |
| 2005/0086021 A1* | 4/2005 | Khandros | | G01R 31/3025 702/121 |
| 2008/0204055 A1* | 8/2008 | Pagani | | G01R 31/2886 324/750.3 |
| 2009/0167339 A1 | 7/2009 | Marshall et al. | | |
| 2011/0006794 A1* | 1/2011 | Sellathamby | | G01R 31/3025 324/754.03 |
| 2011/0279138 A1* | 11/2011 | Mutnury | | G01R 31/2806 324/755.01 |

FOREIGN PATENT DOCUMENTS

| | | |
|---|---|---|
| JP | H03228345 A | 10/1991 |
| JP | H04199651 A | 7/1992 |
| JP | H0595036 A | 4/1993 |
| JP | H06244254 A | 9/1994 |
| JP | H07193108 A | 7/1995 |
| JP | 2002093917 A | 3/2002 |
| JP | 2002093918 A | 3/2002 |
| JP | 2005277338 A | 10/2005 |
| JP | 2005353815 A | 12/2005 |

* cited by examiner

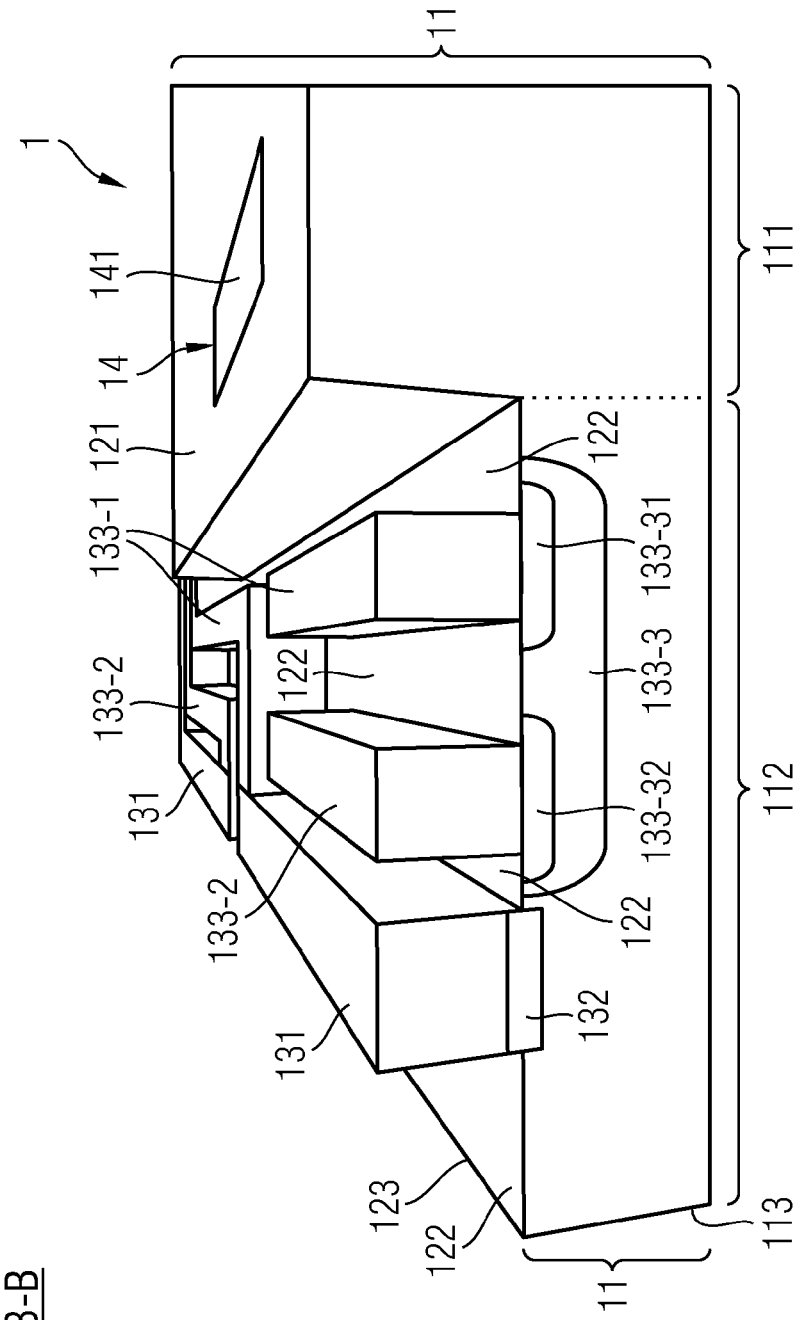

CONTACTLESS DAMAGE INSPECTION OF PERIMETER REGION OF SEMICONDUCTOR DEVICE

PRIORITY CLAIM

This application claims priority to German Patent Application No. 10 2014 222 203.6 filed on 30 Oct. 2014, the content of said application incorporated herein by reference in its entirety.

TECHNICAL FIELD

This specification refers to embodiments of semiconductor devices, methods of manufacturing a semiconductor device, apparatuses for contactless testing of a semiconductor device and methods of contactless testing of a semiconductor device. For example, this specification refers to embodiments of IGBTs, MOSFETs, diodes and the like, as well as to embodiments of methods of manufacturing and testing such devices and to embodiments of apparatuses for testing such devices. In particular, this specification refers to embodiments of a semiconductor device having means for allowing a contactless testing of a perimeter semiconductor region of the semiconductor device.

BACKGROUND

Many functions of modern devices in automotive, consumer and industrial applications, such as converting electrical energy and driving an electric motor or an electric machine, rely on semiconductor devices. For example, Insulated Gate Bipolar Transistors (IGBTs) and Metal Oxide Semiconductor Field Effect Transistors (MOSFETs) and diodes have been used for various applications including, but not limited to switches in power supplies and power converters.

Damages of the perimeter semiconductor region (which is also referred to as 'chip edge structure' or 'termination structure') of such semiconductor device that is used in one of these exemplarily mentioned applications can lead to a functional deficiency of the semiconductor device itself and, eventually, to a malfunction or a failure of the system in which the respective semiconductor device is used.

Therefore, it may be desirable to keep semiconductor devices exhibiting damages of the chip edge structure from being shipped into the field.

To this end, it is known that a semiconductor device is optically screened before being shipped into the field, so as to be able to detect damages of the chip edge or termination structure of the semiconductor device, i.e., in order to detect damages in the perimeter semiconductor region of the semiconductor devices.

However, such optical screening can be a rather complex task and may require high cost software based inspection tools in order to allow for automatic detection of damages in the perimeter semiconductor region.

SUMMARY

It is an object to provide means that allow for low complex inspection of a perimeter semiconductor region of a semiconductor device.

According to an embodiment, a power semiconductor device is provided. The power semiconductor device comprises a semiconductor body. The semiconductor body comprises an active semiconductor region and a perimeter semiconductor region surrounding the active semiconductor region. The active semiconductor region has an active surface area and the perimeter semiconductor region has a perimeter surface area. The power semiconductor device further comprises a test structure for contactless testing of the perimeter semiconductor region. The test structure includes an electrically conductive path that is mounted on the perimeter surface area. The test structure is configured to extract energy from a remotely generated electromagnetic radio frequency test field.

According to a further embodiment, a method of manufacturing a power semiconductor device is presented. The method comprises producing a semiconductor body that comprises an active semiconductor region and a perimeter semiconductor region surrounding the active semiconductor region, the active semiconductor region having an active surface area and the perimeter semiconductor region having a perimeter surface area. The method further comprises generating a front side metallization on the active surface area, the front side metallization comprising front side metallization material. The method further comprises producing a test structure on the perimeter surface area, the test structure being suited for contactless testing of the perimeter semiconductor region, such that the test structure is configured to extract energy from a remotely generated electromagnetic radio test field. Producing the test structure includes generating an electrically conductive path on the perimeter surface area, wherein the electrically conductive path comprises the same front side metallization material as the front side metallization.

According to yet a further embodiment, an apparatus for contactless testing of a perimeter semiconductor region of a power semiconductor device is provided. The apparatus comprises a generator that is arranged for generating an electromagnetic radio frequency test field remotely from the power semiconductor device and for directing the generated electromagnetic radio frequency test field to a test structure of the semiconductor device. The apparatus further comprises a test signal detector that is arranged for detecting a test signal that has been produced by the test structure in dependence of an energy the test structure has extracted from the electromagnetic radio frequency test field.

According to yet a further embodiment, a method of contactless testing of a perimeter semiconductor region of a power semiconductor device is presented. The method comprises generating an electromagnetic radio test field remotely from the power semiconductor device and directing the generated electromagnetic radio frequency test field to a test structure of the semiconductor device. The method further comprises detecting a test signal that has been produced by the test structure in dependence of an energy the test structure has extracted from the electromagnetic radio frequency test field.

Within the present specification, the power semiconductor device is also simply referred to as "semiconductor device".

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals designate corresponding parts. In the drawings:

FIG. 2B schematically illustrates a perspective side view on a section of a vertical cross-section of a semiconductor device according to one or more embodiments;

DETAILED DESCRIPTION

Figure 1A:
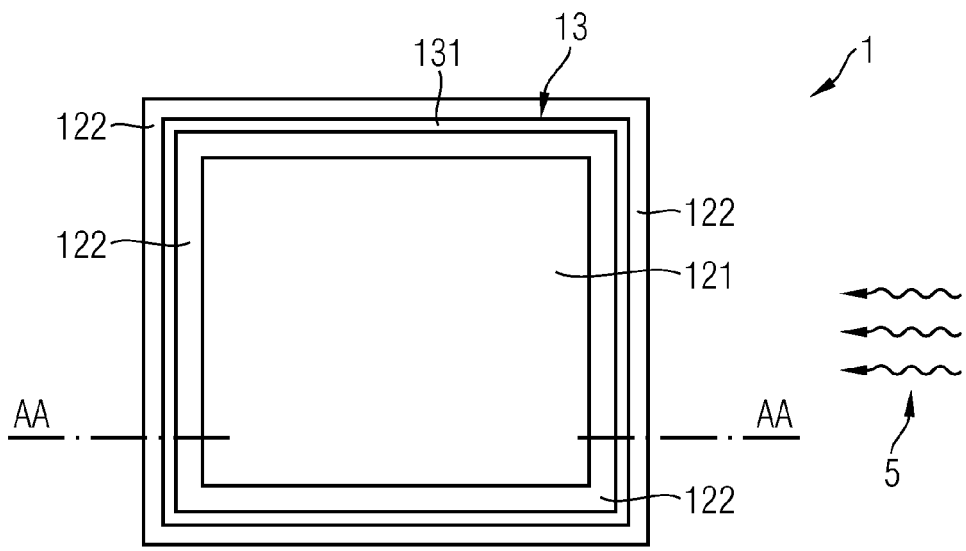
FIG. 1A schematically illustrates a section of a horizontal cross-section of a semiconductor device according to one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor body region. This can be for instance the surface of a wafer or a die.

The term "vertical" as used in this specification intends to describe an orientation which is substantially arranged perpendicular to the horizontal surface, i.e. parallel to the normal direction of the surface of the semiconductor substrate or semiconductor body region.

In this specification, p-doped is referred to as first conductivity type while n-doped is referred to as second conductivity type. Alternatively, the semiconductor devices can be formed with opposite doping relations so that the first conductivity type can be n-doped and the second conductivity type can be p-doped.

Specific embodiments described in this specification pertain to, without being limited thereto, power semiconductor devices, in particular to monolithically integrated semiconductor devices having an IGBT, a RC-IGBT, a diode or a MOSFET structure.

The term "power semiconductor device" as used in this specification intends to describe a semiconductor device on a single chip with high voltage blocking and switching and/or high current carrying and switching capabilities. In other words, power semiconductor devices are intended for high current, typically in the Ampere range, e.g., up to several hundred Ampere, and/or high voltages, typically above 200 V, more typically 600 V and above, such as 5000 V and even above that voltage. Further, said power semiconductor devices may be suited for being used in power supplies and power converters.

In the context of the present specification, the terms "in ohmic contact", "in electric contact", "in ohmic connection", and "electrically connected" intend to describe that there is a low ohmic electric connection or low ohmic current path between two regions, sections, portions or parts of a semiconductor device or an apparatus for testing a semiconductor device, or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

Figure 1B:
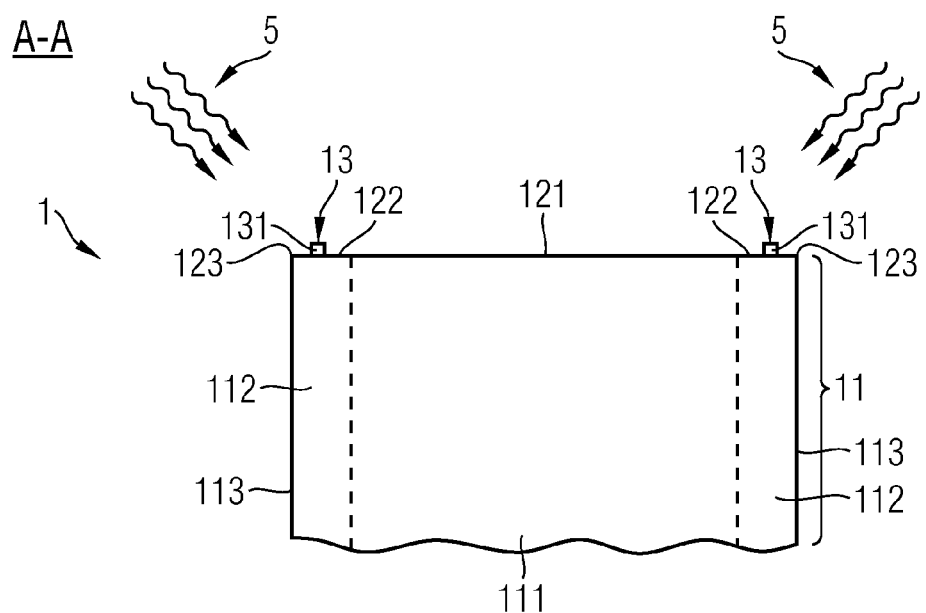
FIG. 1B schematically illustrates a section of a vertical cross-section of a semiconductor device according to one or more embodiments.

FIG. 1A schematically illustrates a section of a horizontal cross-section of a semiconductor device 1 according to one or more embodiments. In correspondence to FIG. 1A, FIG. 1B schematically illustrates a section of the vertical cross-section of the semiconductor device 1 according to one or more embodiments.

The semiconductor device 1 comprises a semiconductor body 11, wherein the semiconductor body 11 includes an active semiconductor region 111 and a perimeter semiconductor region 112. The perimeter semiconductor region 112 surrounds the active semiconductor region 111 and may thus be regarded as a chip edge structure or as a chip termination structure of the semiconductor device 1. Further, as indicated in FIG. 1B, the perimeter surface area 122 may be terminated by a surrounding edge 123 and the perimeter semiconductor region 112 may be terminated by surrounding side walls 123.

The semiconductor device 1 may be configured for conducting a load current, in particular by means of said active semiconductor region 111. In other words, a load current, conducted by the semiconductor device 1 may substantially traverse through at least parts of the active semiconductor region 111 and the semiconductor device 1 may be constructed such that the load current substantially does not traverse through the perimeter semiconductor region 112.

The active semiconductor region 111 has an active surface area 121 and the perimeter semiconductor region 112 has a perimeter surface area 122. In accordance with the embodiments illustrated by FIG. 1A and FIG. 1B, the perimeter surface area 122 completely surrounds the active surface area 121. For example, a front side metallization of a load contact structure (not shown in FIG. 1A and FIG. 1B) may be deposited on the active surface area 121 and may be configured for feeding said load current into the semiconductor body 11, in particular into the active semiconductor region 111.

The semiconductor device 1 comprises a test structure 13 for contactless testing of the perimeter semiconductor region 112. In particular, the test structure 13 may be configured for inspecting the semiconductor device 1 with respect to mechanical damages that may or may not be present in the perimeter semiconductor region 112.

The test structure includes an electrically conductive path 131 that is mounted on the perimeter surface area 122. In particular, the electrically conductive path 131 may be in contact with the perimeter semiconductor region 112. The test structure 13 is configured for extracting energy from a remotely generated electromagnetic radio frequency test field 5.

The electromagnetic radio frequency test field 5, in the following also referred to as 'RF test field 5', may be generated remotely from the semiconductor device, i.e., at a distance of some centimeters or some meters. To this end, a RF test field generator may be provided, which will be explained in more detail further below. As will be explained in more detail below, the RF test field generator may comprise one or more excitation means for generating said RF test field 5. For some applications, it may be supportive to position at least one of such excitation means in proximity to the electrically conductive path 131, for example, at a distance of some 100 μm.

Since the electrically conductive path 131 is mounted on the perimeter surface area 122, the test structure 13 is mechanically coupled to the perimeter semiconductor region 112. Specifically, the test structure 13 may form, at least partially, an integral part of the semiconductor device 1, in particular of said semiconductor region 112. Therefore, the mechanical setup of the perimeter semiconductor region 112 may influence the setup of the test structure 13, in particular the layout of the electrically conductive path 131. For example, a mechanical damage of the perimeter semiconductor region 112 may damage the electrically conductive path 131 such that the path 131 has a high ohmic resistance, e.g., due to an interruption of the path 131 caused by said mechanical damage.

The electrically conductive path 131 may be a closed or an almost closed path that completely or almost completely surrounds the active surface area 121 at least once. For example, the electrically conductive path 131 may exhibit a course such that the electrically conductive path 131 orbits the active surface area 121 more than once, for example twice or three times or even more times.

For example, should the perimeter semiconductor region 112 exhibit one or more mechanical damages, such as cracks, crevices, fissures, gaps, and the like, the energy that is extracted from the RF test field 5 by the test structure 13 may decrease substantially, e.g. to approximately zero. However, if the perimeter semiconductor region 112 does not exhibit any mechanical damages, said extracted energy may differ substantially from zero. Thus, the test structure 13 may allow for low complex contactless testing of the perimeter semiconductor region 112.

For testing, whether or not the semiconductor device 1 exhibits mechanical damages within the perimeter semiconductor region 112 it may be sufficient to measure, e.g., by means of the RF test field 5, a physical parameter of the test structure 13, for example, an inductance of the electrically conductive path 131.

In particular, the test structure 13 may also be configured for producing a test signal in dependence of the extracted energy, such that the produced test signal is arranged to be detected by a test signal detector (not shown in FIG. 1A and FIG. 1B) positioned remotely from the semiconductor device 1.

For example, the detectable test signal produced by the test structure 13 may be a light signal. To this end, the test structure 13 may comprise a diode (not shown), wherein the diode is electrically coupled to the electrically conductive path 131 and arranged for converting the energy extracted from the RF test field 5 into a detectable light signal. For example, presence of the light signal may be indicative for the absence of mechanical damages in the perimeter semiconductor region 112, and absence of the light signal or, respectively, a weak light signal may be indicative for the presence of mechanical damages in the perimeter semiconductor region 112. In another embodiment, a high light intensity or a certain color of the light signal may be indicative for the absence of mechanical damages in the perimeter semiconductor region 112, and a low intensity light signal or, respectively, another color of the light signal may be indicative for the presence of mechanical damaged in the perimeter semiconductor region 112.

According to another embodiment, the detectable test signal produced by the test structure 13 may be based on the generation of heat by the test structure 13, i.e., on power dissipation in dependence of the energy extracted from the RF test field 5. For example, the test structure 13 is configured for converting said extracted energy into ohmic losses that may be detected, e.g., by means of a test signal detector comprising a thermal infrared detector. For example, high ohmic losses, i.e., a high change in temperature of the test structure 13 may be indicative for the absence of mechanical damages in the perimeter semiconductor region 112 and low or no ohmic losses, i.e., a low change in temperature of the test structure 13 may be indicative for the presence of mechanical damages in the perimeter semiconductor region 112.

Further examples of a test signal and other ways of inspecting the semiconductor perimeter region will be given below. Summarizing, mechanical damages in the perimeter semiconductor region 112 may result in that the test structure 13 is not being configured anymore for extracting energy from the RF test field 5, e.g., in that the test structure 13 is not being configured anymore for converting extracted energy into a detectable test signal. This may allow for low complex and low cost inspection of the semiconductor device 1.

For example, the detectable test signal may also be the extracted energy as such. An amount of energy extracted from the RF test field 5 may be detected, wherein a high amount of extracted energy may be indicative for the absence of mechanical damages in the perimeter semiconductor region 112 and wherein a low amount of extracted energy may be indicative for the presence of mechanical damages in the perimeter semiconductor region 112.

As indicated in FIG. 1A, the electrically conductive path may be a closed path. A closed electrically conductive path 131 can advantageously be used for generating said detectable test signal, e.g., for generating said ohmic losses.

At this point, it shall again be remarked that the electrically conductive path 131 may include or, respectively, be electrically coupled to the diode (not shown) for generating said light signal, wherein said diode may be formed by a simple appropriate pn-junction.

Figure 2A:
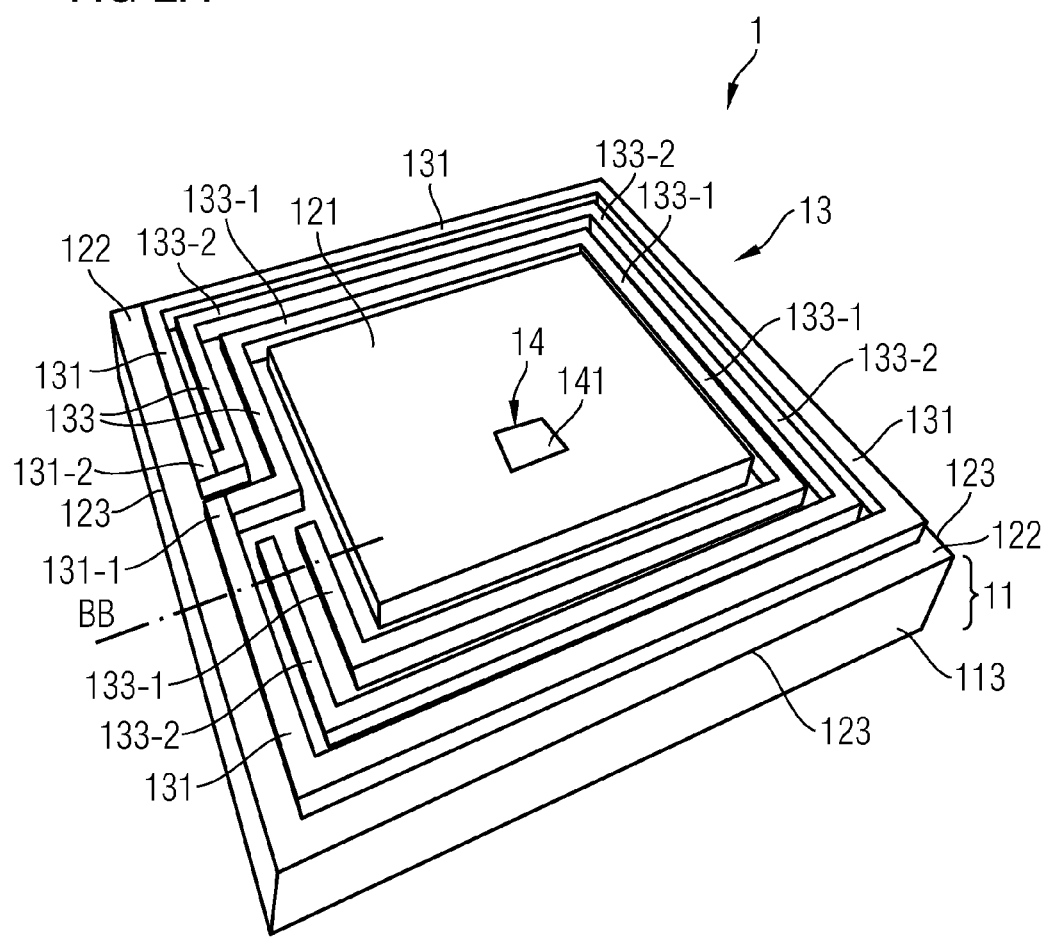
FIG. 2A schematically illustrates a perspective top view on a section of semiconductor device according to one or more embodiments.

FIG. 2A schematically illustrates a perspective top view on a semiconductor device 1 according to one or more embodiments. In correspondence to FIG. 2A, FIG. 2B schematically illustrates a perspective side view on a section of a vertical cross-section of the semiconductor device 1 according to one or more embodiments. The principle setup of the semiconductor device 1 depicted in FIG. 2A and FIG. 2B essentially corresponds to the setup depicted in FIG. 1A and FIG. 1B. Accordingly, the semiconductor device 1 comprises said semiconductor body 11 that includes the perimeter semiconductor region 112 and the active semiconductor region 111. For example, the semiconductor body 11 is mainly a n-region.

The active semiconductor region 111 has the active surface area 121 and the perimeter semiconductor region 112 has the perimeter surface area 122, wherein the test structure 13 is at least partially mounted on said active surface area 122.

In FIG. 2A and FIG. 2B, the active surface area 121 is illustrated as being slightly heightened as compared to the perimeter surface area 122. It shall be understood, however, that such slightly heightened arrangement of the active surface area 121 is not necessary for carrying out the testing of the perimeter semiconductor region 112.

On the active surface area 121, there may be mounted a first load contact structure 14 that may include a front side metallization 141. The first load contact structure 14 is only schematically illustrated in FIG. 2A and FIG. 2B. This first load contact structure 14 may be configured for feeding a load current into the semiconductor device 1, in particular into the active semiconductor region 111. In other words, a load current conducted by the semiconductor device 1 particularly traverses through the active semiconductor region 111 and substantially not through the perimeter semiconductor region 112.

For example, the test structure 13 is electrically insulated from the first load contact structure 14. At this point, it shall be noted that the test structure 13 shall not be used for feeding the load current into the semiconductor body 11.

The test structure 13 of the semiconductor device 1 depicted in FIG. 2A and FIG. 2B includes said electrically conductive path 131, which is not completely closed, but only almost closed. Between a first end 131-1 of the electrically conductive path 131 and a second end 131-2 there is a small gap.

The test structure 13 further comprises a capacitor 133 that is electrically coupled to the electrically conductive path 131. Specifically, the capacitor 133 includes a first electrode 133-1 that is electrically connected to the first end 131-1 of the electrically conductive path 131, and a second electrode 133-2 that is electrically connected to the second end 131-2 of the electrically conductive path 131.

As indicated in FIG. 2A, the electrically conductive path 131, the first electrode 131-1 as well as the second electrode 133-2 are each mounted on the perimeter surface area 122 and each substantially surrounds the entire active surface area 121. For example, the electrically conductive path 131, the first electrode 133-1 and the second electrode 133-2 may form a monolithic component that is mounted on the perimeter surface area 122. In other words, the first electrode 133-1, the second electrode 133-2 and the electrically conductive path 131 may be formed by a single electrically conductive path, wherein such single electrically conductive path may completely surround the active surface area 121. Further, such single electrically conductive path may include sections being positioned substantially parallel to each other and apart from each other and exhibiting complementary course directions.

The capacitor 133 may have a capacitance and the electrically conductive path 131 may have an inductance, such that the test structure has at least one resonance frequency that is defined by the inductance of the electrically conductive path 131 and the capacitance of the capacitor 133.

For example, the RF test field 5 is provided with a frequency range that includes said resonance frequency of the test structure 13. Thus, the test structure 13 may extract energy from the RF test field 5. Such extraction of energy can be detected by a corresponding test signal detector, which will be explained in more detail below.

For example, presence of mechanical damages in the perimeter semiconductor region 112 lead to a detuning of the test structure 13 such that the test structure 13 has a significantly different resonance frequency or no resonance frequency at all due to the mechanical damages in the perimeter semiconductor region 112.

However, if there are no mechanical damages present in the perimeter semiconductor region 112, the test structure 13 remains tuned and it extracts energy from the RF test field 5, if the RF test field 5 is provided with a frequency range that includes the resonance frequency.

In a further embodiment, the first end 131-1 and the second end 131-2, which are spaced apart from each other, may both be electrically coupled to a bulk region of the semiconductor device 1. In such embodiment, the test structure 13 may convert the extracted energy into ohmic losses. Said bulk region may be a part of the semiconductor perimeter region 112. Further, the test structure 13 may then not comprise any pn-junction or not be coupled to any pn-junction. In another embodiment, the electrically conductive path 131 may include or, respectively, be electrically coupled to a diode (not shown in FIG. 2A) for generating said light signal, wherein said diode may be formed by an appropriate pn-junction. For example, the first end 131-1 may be coupled to n-region (or p-region) of the semiconductor perimeter region 112 and the second end 131-2 may be coupled to p-region (or n-region) of the semiconductor perimeter region 112.

Regarding now in particular FIG. 2B, the semiconductor device 1 may further comprise an insulator 132, such as a dielectric, e.g., an oxide, wherein the insulator 132 electrically insulates the electrically conductive path 131 from the perimeter semiconductor region 112. In particular, the electrically conductive path 131 may be mechanically coupled to the perimeter semiconductor region 112 by means of said insulator 132.

The test structure 13 can further comprise a well 133-3 that is included in the perimeter semiconductor region 112. The well 133-3 may comprise charge carriers of a first conductivity type. For example, the well 133-3 is mainly a p-region.

In particular, as indicated in FIG. 2B, said well 133-3 and/or said insulator 132 may form an integral part of the perimeter semiconductor region 112. Further, the electrodes 133-1 and 133-2 and/or the electrically conductive path 131 may be in contact with the perimeter surface area 122. Therefore, mechanical damages within the perimeter semiconductor region 112 may detune the test structure 13, such that the test structure 13 is not configured anymore for said energy extraction, e.g., such that the test structure 13 has a substantially altered resonance frequency.

In case the test structure 13 extracts energy from the RF test field 5, an electric field generated by said electrodes 133-1 and 133-2 in response to said extraction may extend into the well 133-3. In other words, the test structure 13 may convert at least a part of the extracted energy into said electric field between the electrodes 133-1 and 133-2, wherein the generated electric field traverses through the perimeter semiconductor region 112, in particular, at least partially through said well 133-3.

The well 133-3 may include a first zone 133-31 and a second zone 133-32, wherein both zones 133-31 and 133-32 can comprise charge carriers of a second conductivity type. For example, both zones 133-31 and 133-32 are mainly $n^+$-regions. The first zone 133-31 can be in contact with the first electrode 133-1 and the second zone 133-32 can be positioned apart from the first zone 133-31 and be in contact with the second electrode 133-2 of capacitor 133. Thus, the test structure 13 may comprise two pn-junctions, wherein a first pn-junction is formed by a transition between the first zone 133-31 and the well 133-3 and wherein a second pn-junction is formed by a transition between the second zone 133-32 and the well 133-3. Summarizing, the setup of the capacitor 133 illustrated in FIG. 2A and FIG. 2B may constitute a varactor structure. Alternatively, the capacitor 133 may be formed by means of a thin gate oxide positioned in between the electrodes 133-1 and 133-2.

Figure 3:
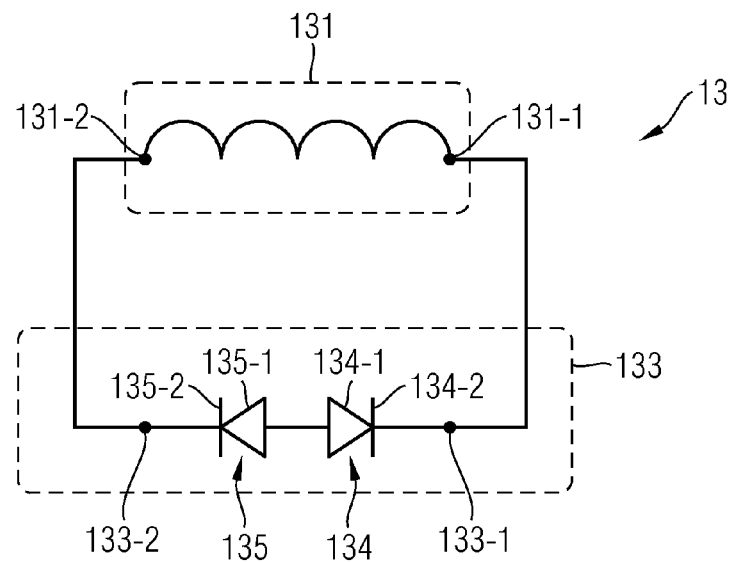
FIG. 3 schematically illustrates an equivalent circuit of a test structure of a semiconductor device according to one or more embodiments.

FIG. 3 schematically illustrates an equivalent circuit of the test structure 13 depicted in FIG. 2A and FIG. 2B. Accordingly, the test structure 13 includes said electrically conductive path 131 which has an inductance and is, therefore, illustrated as a coil. The capacitor 133 is connected in parallel to the electrically conductive path 131, wherein the first electrode 133-1 is electrically connected to the first end 131-1 and the second electrode 133-2 is connected to the second end 131-2 of the electrically conductive path 131. Further, the electrical field generated between the electrodes 133-1 and 133-2 extends into said well 133-3 included in the perimeter semiconductor region 112. The first pn-junction formed by a transition between said first zone 133-31 and the well 133-3 is represented as a first diode 134 and the second pn-junction formed by a transition between said second zone 133-32 and the well 133-3 is represented as a second diode 135.

Accordingly, both the anode 134-1 of the first pn-junction (diode) 134 and the anode 135-1 of the second pn-junction (diode) 135 are formed by the well 133-3 that comprises the charge carriers of the first conductivity type. The cathode 134-2 of the first pn-junction (diode) 134 is formed by the first zone 133-31 that comprises charge carriers of the second conductive type and that is connected to the first electrode 133-1 of the capacitor 133. Correspondingly, the cathode 135-2 of the second pn-junction (diode) 135 is formed by the second zone 133-32 that comprises charge carriers of the second conductive type and that is connected to the second electrode 133-2 of the capacitor 133. Thus, the two pn-junctions 134 and 135 are connected anti-serially to each other.

Figure 4:
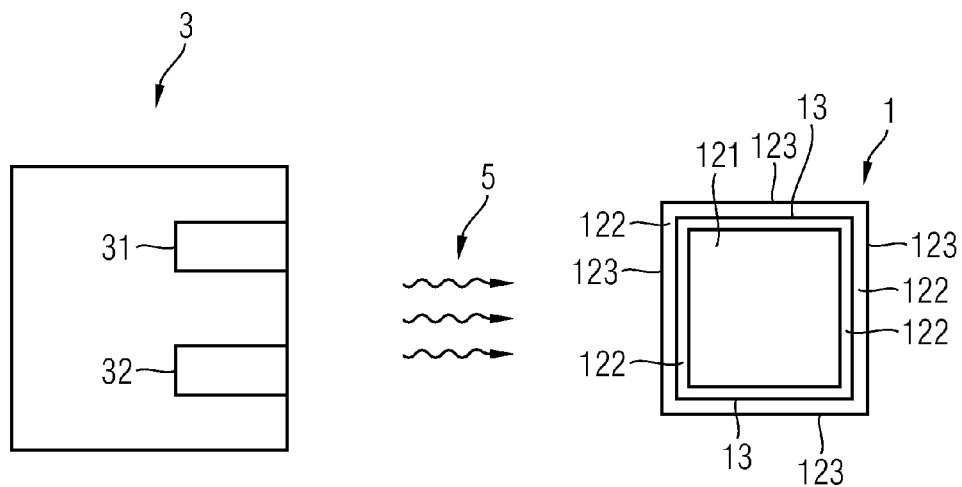
FIG. 4 schematically illustrates a block diagram of an apparatus for contactless testing of a semiconductor device according to one or more embodiments.

FIG. 4 schematically illustrates a block diagram of an apparatus 3 for contactless testing of a semiconductor perimeter region of a semiconductor device 1 according to one or more embodiments. For simplicity, the semiconductor device 1 depicted in FIG. 4 is illustrated similarly to the embodiment illustrated in FIG. 1A. However, it should be understood that the semiconductor device 1 under test could exhibit any other setup, e.g., the setup as exemplary illustrated in FIG. 2A and 2B. Regarding the semiconductor device 1 that is tested by apparatus 3, it may thus be referred to the foregoing description, in particular to the description regarding FIG. 1A and FIG. 1B.

The apparatus 3 comprises a generator 31 and a test signal detector 32, which may be operatively coupled to each other. The generator 31 is arranged for generating the RF test field 5 remotely from the semiconductor device 1 and for directing the generated RF test field 5 to the test structure 13 of the semiconductor device 1.

For example, the apparatus 3 and the semiconductor device 1 can be positioned apart from each other. In particular, an exact positioning of the semiconductor device 1 is not necessary in order to test the semiconductor device 1. It should only be ensured that the RF test field 5 is received by the test structure 13, such that the test structure 13 may extract energy from the RF test field 5.

As has been explained in detail above, the test structure 13 of the semiconductor device 1 may be configured for generating a test signal in dependence of the extracted energy, such that the test signal may be detected by the test signal detector 32 of the apparatus 3. Various examples of such a detectable test signal have been given above. Summarizing, the test signal may be constituted by the amount of the extracted energy itself. Thus, the test signal detector 32 may be configured for detecting that a certain amount of the energy of the generated RF test field 5 has been extracted by the test structure 13. In another embodiment, the test signal generated by the test structure 13 is a light signal. To this end, as has been explained above, the test structure 13 may comprise a diode that is configured for converting the extracted energy into a light signal. Accordingly, the test signal detector 32 may be configured for detecting such light signal.

In another embodiment, the test structure 13 may be configured for converting the extracted energy into ohmic losses, thereby producing heat (power dissipation). Thus, the test signal detector 32 may be configured for detecting a change in temperature of the semiconductor device 1. For example, such detection can be based on thermal-infrared detection.

For example, a high amount of extracted energy, for example a strong light signal or a significant change in temperature of the semiconductor device 1 may be indicative for the absence of mechanical damages in the perimeter semiconductor region 112 of the semiconductor device 1. However, if the test structure 13 does extract substantially no energy from the RF test field 5, for example, if the test structure only produces a weak light signal or no light signal, or if the semiconductor device 1 does not exhibit a significant change in temperature upon being exposed to the RF test field 5, this may be indicative for the presence of mechanical damages within the perimeter semiconductor region 112. This is because mechanical damages within the perimeter semiconductor region 112 may also damage the test structure 13 such that the test structure 13 is not being able anymore to extract energy from the RF test field 5, as has been explained in more detail above.

Now generally speaking, the semiconductor device 1 may be configured for being operated at a frequency of some kHz up to several hundred kHz. Such operating frequency is typical for power semiconductor devices mentioned above. To give an example, a power IGBT may be operated at switching frequency of up to several hundred kHz. For example, the generator 31 provides the RF test field 5 with a frequency that is at least twice high as the operating frequency for which the semiconductor device 1 is designed.

For example, the RF test field 5 generated by generator 31 has a frequency in the range of several MHz. In an embodiment, the test structure 13 is only arranged for extracting energy from the RF test field 5, if the frequency of the RF test field 5 is a multiple of the operating frequency range for which the semiconductor device 1 is arranged.

Figure 5:
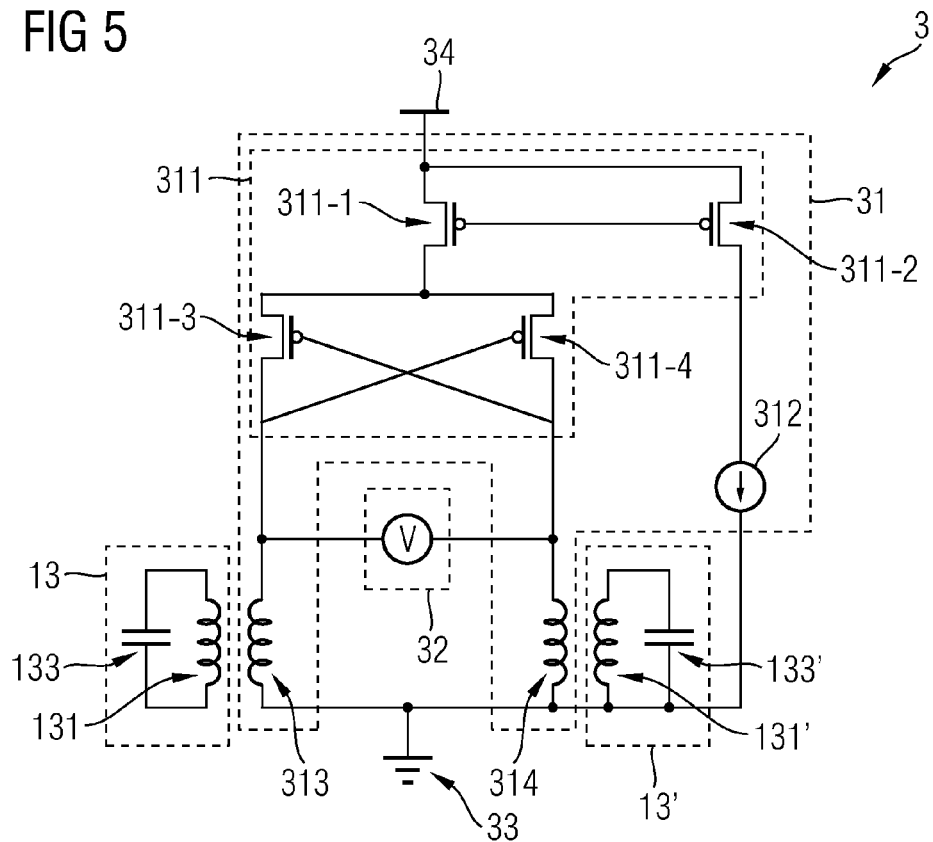
FIG. 5 schematically illustrates a circuit diagram of an apparatus for contactless testing of a semiconductor device according to one or more embodiments.

A circuit diagram of an exemplary embodiment of the apparatus 3 is schematically illustrated in FIG. 5. Accordingly, the generator 31 may comprise a power circuit 311, the power circuit including four switches 311-1 to 311-4, which may be semiconductor transistors. The power circuit 311 of the generator 31 is coupled to first excitation means 313 and a second excitation means 314. Both the first excitation means 313 and the second excitation means 314 can be implemented by means of a respective coil. Further, the power circuit 311 may be coupled to a voltage source 34 and to ground 33. Further, generator 31 may comprise a current source 312 coupled between ground 33 and switch 311-2. The current source 312 may be a DC current source that provides a bias current. The power circuit 311 can be configured for providing a first electric power signal to the first excitation means 313 and a second electric power signal to the second excitation means 314.

The first excitation means 313 may convert the first electric power signal into said RF test field 5. The second excitation means 314 may convert the second electric power signal into an electromagnetic radiofrequency reference field, in the following referred to as RF reference field.

The RF test field is received by the test structure 13, wherein the test structure 13 exemplary comprises said capacitor 133 and said electrically conducive path 131, as illustrated in FIG. 5. A distance between the electrically conductive path 131 and the first excitation means 313, e.g., implemented as said coil, may amount to some 100 µm. For example, said distance is within a range of 90 µm to 900 µm.

The RF reference field is received by a reference structure 13', which may form a part of said apparatus 3. The reference structure 13' is also coupled to ground 33. In particular, the reference structure 13' may exhibit a similar or identical setup as compared to the test structure 13. Accordingly, the reference structure 13' may comprise a reference path 131' and a reference capacitor 133', wherein the reference path 131' may have the same or a similar inductance as the electrically conductive path 131 and wherein the reference capacitor 133' may have the same or a similar capacitance as the capacitor 133 of test structure 13.

Accordingly, the generator 31 may have an oscillator structure that may have an oscillator frequency that depends on the test structure 13. In the setup schematically illustrated in FIG. 5, the test signal generated by the test structure 13 may influence a differential voltage measurable at outputs of the power circuit 311. Such differential voltage may be measured by the test signal detector 32, which may include a corresponding measurement device.

If the test structure 13 is detuned due to mechanical damages within the perimeter semiconductor region 112, a frequency of the differential voltage detected by test signal detector 32 may be different as compared to a frequency that would be present if the test structure 13 that would not be detuned due to mechanical damages within the perimeter semiconductor region 112, i.e., different as compared to a frequency that would be generated in case of an absence of mechanical damages within the perimeter semiconductor region 112.

Figure 7:
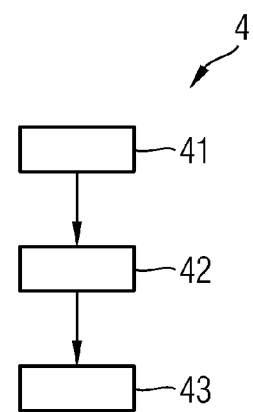
FIG. 7 schematically illustrates a flow diagram of a method of testing a semiconductor device according to one or more embodiments.

FIG. 7 schematically illustrates a flow diagram of a method 4 of testing a semiconductor perimeter region a semiconductor device according to one or more embodiments, e.g., for testing the semiconductor device 1 according to one of the embodiments illustrated in FIG. 1A to 2B. The method 4 comprises the step of generating 41 an electromagnetic radio frequency test field 5 remotely from the semiconductor device 1 and directing, in a second step 42, the generated electromagnetic radio frequency test field 5 to the test structure 13 of the semiconductor device 1. In a third step 43, a test signal is detected that has been produced by the test structure 13 in dependence of an energy the test structure 13 has extracted from the electromagnetic radio frequency test field 5. Summarizing, the method 4 of contactless testing of a semiconductor device 1 may constitute a method of operating the apparatus 3 described with reference to FIG. 4 and FIG. 5. In so far, it is referred to the description above.

Figure 6:
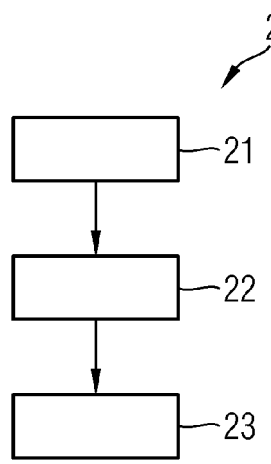
FIG. 6 schematically illustrates a flow diagram of a method of manufacturing a semiconductor device according to one or more embodiments.

FIG. 6 schematically illustrates a flow diagram of a method 2 of manufacturing a semiconductor device according to one or more embodiments, for example of manufacturing the semiconductor device 1 according to one of the embodiments illustrated in FIG. 1A to 2B.

In a first step 21, the semiconductor body 11 is produced, wherein the semiconductor body 11 includes the active semiconductor region 111 and a perimeter semiconductor region 112 that surrounds the active semiconductor region 111. As explained above, the active semiconductor region 111 has the active surface area and the perimeter semiconductor region 112 has the perimeter surface area 122. For example, the semiconductor body 11 may be produced such that the semiconductor body 11 comprises charge carriers of the second conductivity type.

In a second step 22, a front side metallization 141 is generated on the active surface area 121, wherein the front side metallization comprises front side metallization material. For example, the front side metallization 141 may be configured for feeding a load current into the semiconductor body 11, in particular, into the active semiconductor region 111.

In a third step 23, a test structure 13 is produced on the perimeter surface area 122. The step of producing the test structure 13 includes generating said electrically conductive path 131 on the perimeter surface area 122. The electrically conductive path 131 is produced such that it comprises the same front side metallization material as the front side metallization 141. For example, both the electrically conductive path 131 and the front side metallization 141 comprise at least one of aluminum, an aluminum alloy, copper, gold, silver and/or a further metal alloy. In another embodiment, the front side metallization material that may be included in both the electrically conductive path 131 and the front side metallization 141 comprises at least one of nickel, highly doped poly silicon, magnesium and/or a magnesium alloy.

For example, the front side metallization 141 and the electrically conductive path 131 are generated simultaneously. For example, both the front side metallization 141 and the electrically conductive path 131 may be generated by employing the same metallization apparatus. In other words, generating the test structure 13 on the perimeter surface area 122 can be easily integrated into already existing semiconductor manufacturing lines, since the same metallization apparatus may be employed and/or since the electrically conductive path 131 and the front side metallization 141 may have the same front side metallization material. In an embodiment, also the capacitor 133 including said electrodes 133-1 and 133-2 may comprise the same front side metallization material as the front side metallization 141.

As described above, the test structure 13 may be configured for extracting energy from said RF test field 5. Within the scope of the present description, however, said formulation does not necessarily imply that the test structure 13 has to "absorb" the extracted energy, e.g., by converting the extracted energy into ohmic losses, into light, or into something similar. E.g., considering the embodiment schematically illustrated in FIG. 5, the test structure 13 may essentially only comprise said capacitor 133 and said electrically conductive path and, thus, does hardly produce any ohmic losses upon being subjected to the RF test field 5.

In accordance with one or more embodiments, due to the test structure that may be at least partially mounted on the perimeter surface area of the perimeter semiconductor region of the semiconductor device and/or at least partially included in the perimeter semiconductor region, damages in the perimeter semiconductor region (also referred to as 'chip edge structure' or 'termination structure') may be easily detected by means of providing said electromagnetic radio frequency test field to the test structure.

Since the test structure is mechanically coupled to the perimeter semiconductor region, mechanical damages, such as cracks, crevices, fissures, craters, gaps, and the like, that may or may not be included in the perimeter semiconductor region may influence the layout of the test structure. Thus, the amount of energy the test structure extracts from the remotely generated electromagnetic radio frequency test field may depend on whether or not the perimeter semiconductor region exhibits mechanical damages. In other words, the amount of energy extracted from the remotely generated electromagnetic radio frequency test field may differ substantially in dependence of whether or not the perimeter semiconductor region exhibits mechanical damages. Therefore, the test structure of the semiconductor device allows for low complex contactless testing of the semiconductor device. The semiconductor device may be easily inspected before being shipped into the field. Moreover, the semiconductor device may be inspected when already being installed in a converter system or being used within another application.

Features of further embodiments are defined in the dependent claims. The features of further embodiments and the features of the embodiments described above may be combined with each other for forming additional embodiments, as long as said features are not explicitly described as being alternative to each other.

In the above, embodiments pertaining to semiconductor devices, semiconductor components and semiconductor apparatuses were explained. For example, these embodiments are based on silicon (Si). Accordingly, a monocrystalline semiconductor region or layer, e.g., the semiconductor regions 11, 111, 112, 133-3, 133-31, 133-32 of exemplary embodiments, is typically a monocrystalline Si-region or Si-layer. In other embodiments, polycrystalline or amorphous silicon may be employed.

It should, however, be understood that the semiconductor regions 11, 111, 112, 133-3, 133-31, 133-32 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGainN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGainN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
   a semiconductor body comprising an active semiconductor region and a perimeter semiconductor region surrounding the active semiconductor region, the active semiconductor region having an active surface area and the perimeter semiconductor region having a perimeter surface area; and
   a test structure for contactless testing of the perimeter semiconductor region, the test structure having a resonance frequency in an original configuration and comprising an electrically conductive path mounted on the perimeter surface area, wherein the test structure is configured to extract energy from a remotely generated electromagnetic radio frequency test field in the original configuration, the electromagnetic radio frequency test field being provided with a frequency range that includes the resonance frequency of the test structure in the original configuration,
   wherein the test structure is configured to become detuned in an altered configuration of the test structure caused by mechanical damage in the perimeter semiconductor region, such that the test structure has a significantly different resonance frequency or no resonance frequency in the altered configuration.

2. The power semiconductor device of claim 1, wherein the test structure is configured to produce a test signal based on the extracted energy, wherein the produced test signal is arranged to be detected by a test signal detector positioned remotely from the power semiconductor device.

3. The power semiconductor device of claim 1 wherein power semiconductor device further comprises an insulator electrically insulating the electrically conductive path from the perimeter semiconductor region and being at least partially included in the perimeter semiconductor region.

4. The power semiconductor device of claim 1, wherein the electrically conductive path is a closed or an almost closed path that completely or almost completely surrounds the active surface area.

5. The power semiconductor device of claim 1, wherein the electrically conductive path contacts the perimeter semiconductor region.

6. The power semiconductor device of claim 1, wherein:
the test structure comprises a capacitor electrically coupled to the electrically conductive path; and
the test structure has at least one resonance frequency that is defined by an inductance of the electrically conductive path and a capacitance of the capacitor.

7. The power semiconductor device of claim 6, wherein the capacitor comprises a first electrode and a second electrode, the first electrode and the second electrode being mounted on the perimeter surface area, and wherein an electric field between the first electrode and the second electrode extends into the perimeter semiconductor region.

8. The power semiconductor device of claim 7, wherein the electrically conductive path, the first electrode and the second electrode form a monolithic component that is mounted on the perimeter surface area.

9. The power semiconductor device of claim 7, wherein the perimeter semiconductor region includes a well, the well comprising charge carriers of a first conductivity type, and wherein the electric field between the first electrode and the second electrode extends into the well.

10. The power semiconductor device of claim 9, wherein the well includes a first zone and a second zone, the first zone and the second zone each comprising charge carriers of a second conductivity type, and wherein the first zone contacts the first electrode and the second zone contacts the second electrode.

11. The power semiconductor device of claim 1, wherein the perimeter semiconductor region comprises at least one pn-junction, the at least one pn-junction being electrically coupled to the test structure.

12. The power semiconductor device of claim 1, wherein the test structure comprises a diode, the diode being electrically coupled to the electrically conductive path and configured to convert the extracted energy into a detectable light signal in the original configuration, and to produce a weak light signal or no light signal in the altered configuration.

13. The power semiconductor device of claim 1, wherein the electrically conductive path comprises a first end and a second end spaced apart from each other, and wherein both the first end and the second end are electrically coupled to a bulk region of the power semiconductor device.

14. The power semiconductor device of claim 1, wherein the electrically conductive path is configured to convert the extracted energy into a detectable heat signal resulting from high ohmic losses in the original configuration, and to produce reduced ohmic losses or no ohmic losses in the altered configuration.

15. The power semiconductor device of claim 1, further comprising a first load contact structure mounted on the active surface area and electrically insulated from the test structure, wherein the first load contact structure is configured to feed a load current into the active semiconductor region.

16. The power semiconductor device of claim 1, wherein the electromagnetic radio frequency test field has a frequency that is at least twice as high as a frequency of an operating frequency range of the power semiconductor device.

17. The power semiconductor device of rein the semiconductor body comprises silicon carbide.

18. The power semiconductor device of claim 1, wherein the test structure is not connected to any circuitry in the active semiconductor region.

* * * * *